(12) United States Patent
Orcutt et al.

(10) Patent No.: US 6,452,238 B1
(45) Date of Patent: Sep. 17, 2002

(54) MEMS WAFER LEVEL PACKAGE

(75) Inventors: John W. Orcutt, Richardson; Andrew Steven Dewa, Plano; Tsen-Hwang Lin, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 51 days.

(21) Appl. No.: 09/671,487

(22) Filed: Sep. 27, 2000

Related U.S. Application Data (60) Provisional application No. 60/157,560, filed on Oct. 4, 1999.

(51) Int. Cl.$^7$ ................................................. H01L 29/82
(52) U.S. Cl. ........................ 257/415; 257/414; 257/532
(58) Field of Search ................................. 257/415, 414, 257/532

(56) References Cited

U.S. PATENT DOCUMENTS

| | | | |
|---|---|---|---|
| 4,873,871 A | * | 10/1989 | Bai et al. |
| 6,310,371 B1 | * | 10/2001 | Hung |
| 6,326,682 B1 | * | 12/2001 | Kurtz et al. |
| 6,180,989 B1 | * | 1/2002 | Bryant et al. |
| 6,369,931 B1 | * | 4/2002 | Funk et al. |

* cited by examiner

Primary Examiner—Stephen D. Meier
(74) Attorney, Agent, or Firm—Michael K. Skrehot; W. James Brady III; Frederick J. Telecky, Jr.

(57) ABSTRACT

An improved wafer level encapsulated micro-electromechanical device fabricated on a semiconductor wafer and a method of manufacture using state-of-the-art wafer fabrication and packaging technology. The device is contained within a hermetic cavity produced by bonding a silicon wafer with active circuits to an etched silicon wafer having cavities which surround each device, and bonding the two wafer by either thin film glass seal or by solder seal. The etched wafer and thin film sealing allow conductors to be kept to a minimum length and matched for improved electrical control of the circuit. Further, the device has capability for a ground ring in the solder sealed device. The devices may be packaged in plastic packages with wire bond technology or may be solder connected to an area array solder connected package.

11 Claims, 5 Drawing Sheets

MEMS WAFER LEVEL PACKAGE

This application claims the benefit of provisional application Serial No. 60/157,560 filed Oct. 4, 1999.

FIELD OF THE INVENTION

The present invention relates in general to semiconductor packaging, and more specifically to a package for a micro-electromechanical device.

BACKGROUND OF THE INVENTION

Micro-electromechanical devices (MEMS) make use of semiconductor technology to fabricate microscopic mechanisms on the surface of a semiconductor wafer. These devices have a wide range of uses, such as accelerometers, pressure sensors, actuators, and other types of sensors. Due to their size, the microscopic mechanisms are extremely vulnerable to damage from handling, to particles, to air flow and moisture; therefore, packaging of the devices presents many more challenges than conventional integrated circuits. Many of the devices have moving parts which requires a cavity surrounding the device to allow the device to move freely, and so for the most part, the devices have been packaged in ceramic or metal packages having a cavity. However, these options are both an expensive, poorly automated process and they do not resolve the issue of particles from the sawing process during separating the individual devices on a wafer. Further, they are not necessarily optimized for device reliability and performance.

In an attempt to circumvent the problem, such devices have been encapsulated at the wafer level, before separating into individual chips. This provides a technique for avoiding damage to unprotected mechanisms which occurs during the separation and packaging process. In very early work on wafer level packaging, the devices were covered with a thick layer of silicon dioxide during the final wafer processing step. This, of course, was completely unsatisfactory for devices having moving parts.

A more satisfactory solution was provided by V. J. Adams, et al in U.S. Pat. No. 5,323,051 which is incorporated herein by reference. This patent describes a wafer having active devices in a silicon wafer substrate with a second silicon wafer adhered to the substrate to form a cap, and a pattern of walls on the cap formed from frit glass which surround the individual devices. The walls are patterned to surround each device, allowing a hermetic package around each unit after the cap and substrate are bonded by firing the glass. Holes in the cap wafer are provided for electrical connection to the electrodes which pass through the frit glass wall seals. Following bonding of the two wafers, the devices are separated with minimal concern for debris from the sawing process, and each device is housed in a hermetic cavity. There are a number of advantages to this prior art approach, including matched thermal expansion coefficient between the silicon wafer substrate and cap silicon wafers, protection of the devices, and the potential for assembly of the individual devices into low cost plastic packages.

However, fabrication processes for the existing art are not compatible with assembly techniques or equipment which is in well known in state-of-the-art wafer fabrication and/or plastic assembly facilities. Instead, it makes use of screen printing a frit glass compound, which has previously been used in the fabrication of ceramic packages and substrates, but is atypical of current high volume semiconductor processing facilities. Further, a process which relies on a relatively thick patterned frit glass across the surface of a wafer is subject to non-uniformity in stand-off height, as well as to run out or bleed of the molten glass into active areas of the devices. Potential bleed of the glass film into the active circuitry requires that large perimeters be allowed to avoid such a problem, thereby decreasing the number of devices that can be assembled on a given substrate. The large perimeter area required to avoid run-out of the glass also necessitates that the conductor lengths between active circuit and contact pad be long, thereby increasing the lead inductance.

A need exists for a method of packaging micro-electromechanical devices fabricated on a semiconductor wafer before the wafer is diced into individual chips, by making use of state-of-the-art high volume manufacturing techniques from either wafer fabrication or from plastic package assembly. The method must provide a well controlled cavity within which micro-machined parts are free to move, have thermal characteristics which closely match that of the device, allow access for electrical contacts, and be optimized for device performance.

SUMMARY OF THE INVENTION

The present invention provides an improved wafer level encapsulated micro-electromechanical device and method of manufacture for devices fabricated on a semiconductor wafer. The active devices are encapsulated at the wafer level before dicing by adhering a cap wafer having cavities patterned by anisotropic etching of the cap. The cavities correspond to the location of the active circuits, and the unetched portions provide walls which are topped by a thin film of glass sputtered through a patterned mask. The cap wafer is adhered to the substrate by reflowing the glass film and forming a hermetic cavity around each active circuit. Openings for test probes and bond wires are provided through the cap wafer prior to aligning the two wafers and reflowing the glass. The assembled wafers are tested electrically in wafer form by probing with conventional test equipment. The tested devices are subsequently processed using conventional plastic molded package assembly techniques, including dicing with automated saws, attaching the devices to a lead frame, wire bonding through the openings in the cap, and encapsulating with plastic molding compounds.

Precision of the etched cavities and walls, coupled with thin film glass sealing of the wafers minimizes run-out or bleed of the glass into active areas, thereby allowing the circuit and contacts to be spaced in close proximity, supporting both higher density of circuits on the wafers, as well as short contact leads with lower resistivity.

An alternate method for adhering the substrate and recessed cap wafers makes use of solder reflow processing, rather than glass. Advantages include low temperature processing, potential for a ground ring surrounding the circuit, and compatibility with area array packages with solder contacts.

Both embodiments make use of manufacturing equipment and processes currently in production at state-of-the-art wafer fabrication and packaging assembly sites.

DETAILED DESCRIPTION OF THE DRAWINGS

Figure 1:
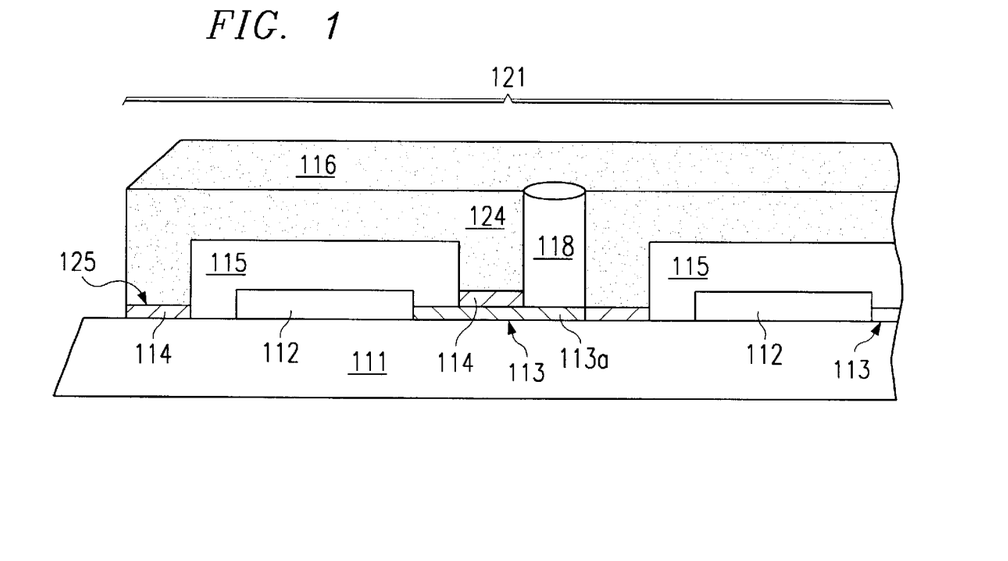
FIG. 1 is a cross sectional view of a device encapsulated within a wafer level package having an etched cap and thin film glass bonding.

FIG. 1 shows a cross sectional view of micro-electromechanical (MEM) devices wherein the semiconductor devices 112 are encapsulated in a cavity within a wafer level package 121 assembly. In the preferred embodiment, the device 112 is an RF circuit with a micro-electromechanical switch controlled by capacitance changes. The device 112 is fabricated on a silicon substrate wafer 111, which comprises a wafer of silicon before the wafer has been diced into a plurality of distinct chips. A cap wafer 116 is prepared by providing a plurality of holes 118 which extend completely through the cap wafer at predetermined locations. A pattern of etched cavities 115 having predetermined dimensions whose locations correspond to a pattern of devices 112 on the substrate wafer. A thin film of glass 114 is deposited on the unattached portion of the cap wafer, i.e., the top 125 portions of the cavity wall 124. The pattern is such that the device 112 will be completely surrounded by the cavity walls 124, but the moveable parts of the MEM will be free to move in all directions.

Holes 118 in the cap wafer 116 formed by drilling or anisotropic etching allow access to contact pads 113a extending from conductor leads 113 electrically coupled to the device. The device circuits may be electrically tested by means of test probes positioned through the holes 118 in the cap. Subsequently wire bonds will be connected through the holes 118 to the contact pads 113a as the devices are assembled into a final package.

The cap wafer 116 is bonded to the semiconductor substrate wafer 111 using the deposited thin film glass 114 as a bonding agent. The bonding comprises aligning the two wafers and heating the cap wafer with glass, and the substrate wafer to a sufficiently high temperature to melt the glass, and subsequently cooling to solidify the glass. In this way, a semiconductor wafer level package is formed as part of a capped wafer structure with the device 112 hermetically sealed in a cavity 115 of predetermined dimensions formed by a combination of the semiconductor substrate, the cap wafer and cavity walls with thin film of glass. Glasses suitable for thin film deposition and reflowing are well known to those versed in the art.

Figure 2:
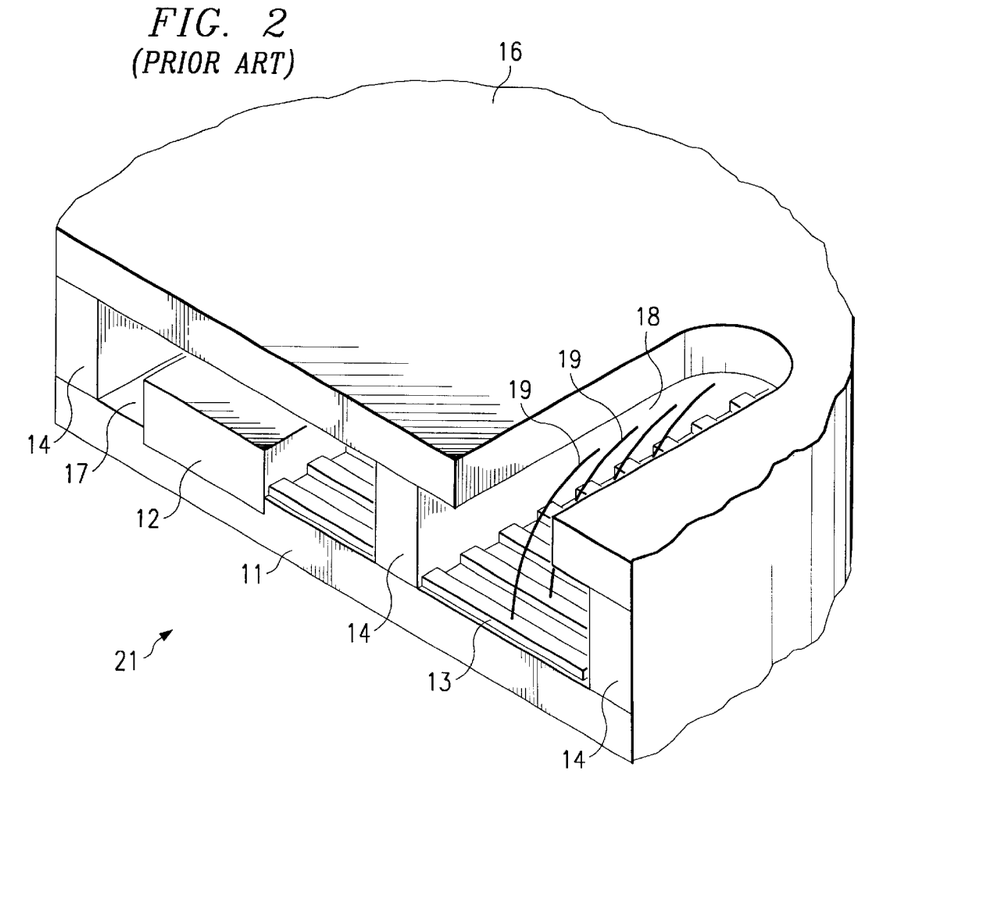
FIG. 2 is a perspective cross sectional view of device encapsulated within a semiconductor wafer level package having frit glass walls. (Prior art)

For comparison, FIG. 2 shows a cross sectional view of one device of known art wherein a semiconductor device 12 is encapsulated within a wafer level package 21. Device 12 is fabricated on a semiconductor substrate wafer 11 which comprises a wafer of semiconductor material before the wafer has been diced into a plurality of distinct chips. A cap wafer 16 is prepared by providing a plurality of holes 18 which extend completely through the cap wafer. A plurality of frit glass walls 14 having predetermined dimensions is deposited on cap wafer 16. The predetermined pattern is such that the device 12 will be completely surrounded by frit glass walls. Frit glass walls 14 have been deposited by silk screening a slurry of a mixture of organic binder and frit glass through a patterned screen, the organic binder burned off and the glass fired at a temperature to allow bonding between the two wafers.

If the device of known art 12 is an electromechanical device having moving parts, it is necessary that the frit glass walls 14 be maintained at sufficient height to allow unrestricted movement of the device. Changes in height of the frit glass walls due to both organic burn out and to glass slump during firing are difficult to control uniformly across the entire surface of the wafers. Further, the weight of the cap wafer adds to the probability of the glass walls collapsing during firing of the frit glass.

Significant difficulty may be expected due to excessive glass flow and run-out into both the active device 12 areas and into the electrical contact areas 13 with the volume of frit glass required to form cavity walls. This property of glass reflow and run-out would in turn require that the spaces between side walls formed by frit glass and the active and contact areas be relatively large to avoid glass contamination, and thereby forcing long conductor paths with increased resistivity.

As illustrated in FIG. 1, cavity walls 124 of the current invention formed by anisotropic etching of silicon cap wafer 116 are spaced in close proximity to both the active circuit 112 and to the conductor contact pads 113a. Metal traces 113 patterned during device fabrication form a plurality of electrodes on the semiconductor substrate wafer which provide electrical coupling to the device and terminate in contact pads 113a. Advantages of very short conductor lengths are both that the number of devices per wafer is increased, and that resistance of the conductors is smaller, thus supporting the requirement for controlled electrical parameters.

Both the silicon substrate 111 and cap 116 wafers are in the range of 0.2 to 0.5 mm thickness and owing to the identical thermal expansion and modulus properties, stress on the seal glass is kept to a minimum. Cavity walls having been anisotropically etched using techniques well known in the industry are in the range of 0.05 to 0.2 mm thickness.

Figure 3A:
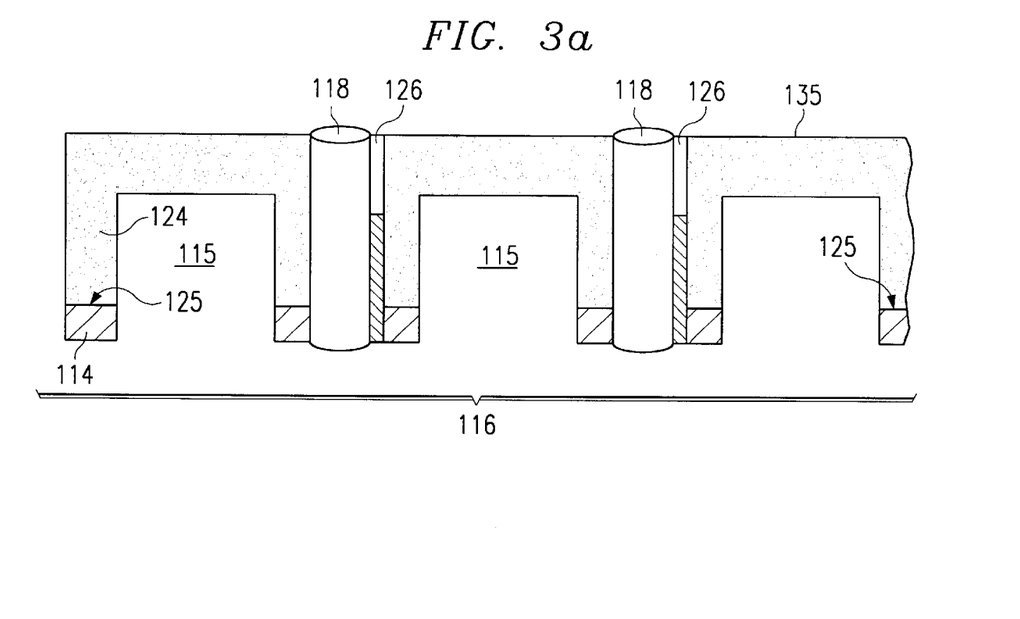
FIG. 3a is a cross sectional view of the cap wafer prior to bonding to a substrate.

FIG. 3 provides a schematic cross sectional view of a portion of the cap wafer 116 having a first 125 and second 135 major surface. An array of holes 118 is drilled or etched completely through a silicon wafer 116. A patterned array of cavities 115 of predetermined dimensions is by anisotropic etching of the silicon wafer, leaving relatively thin silicon walls 124 of precise dimensions. A thin film of glass 114 is deposited by sputtering through a mask having an array of apertures corresponding to the top surface of the cavity walls 125. The glass film 114 is in the range of 0.5 to 5.0 microns. Pattern resolution of the glass is of little significance as long as the top surfaces 125 of the walls 124 are covered in order to provide a seal between the substrate and cap wafers. The devices are spaced to provide an array of scribe streets 126 for subsequently dicing the assembled wafer into individual devices. Deposition of the seal glass by sputtering makes use of equipment and processes well known and accepted in the fabrication of integrated circuit devices.

Figure 3B:
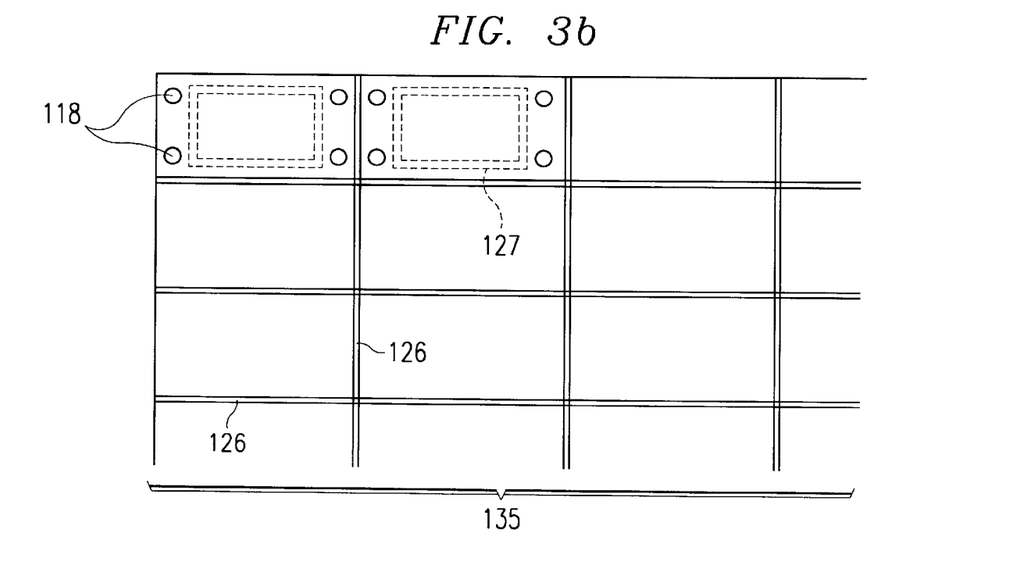
FIG. 3b is a top view of a portion of a cap wafer.

FIG. 3b provides a schematic view of portion of the second surface 135 of cap wafer. An array of scribe streets 126 are provided for separating the assembled devices. Holes 118 through the wafer are provided within each device area. The dashed lines 127 represent the location and area of cavity walls.

The two wafers are typically aligned by means of locating holes formed in each wafer into which an alignment pin is inserted prior to the bonding process. The wafers are further aligned optically by vision systems inserted between the roughly aligned wafers. Vision systems for simultaneous viewing of an upper and lower device are commonly used in the industry for aligning flip chip devices. The capped wafer assemblage is introduced into a chamber having controlled environment, as well as temperature profiling and heating capability. While in a controlled atmosphere, the cap wafer and substrate wafer are heated to bond them together to form a semiconductor wafer level package. The bonding hermetically seals the capped wafer structure capturing the controlled atmosphere within the cavity. The chamber is cooled at a programmed rate as defined by the glass manufacturer in order to assure minimal stress on the joints. Processing temperature profiles and required atmosphere for various glasses are provided by the glass suppliers, and are known in the industry. The capped wafer structure is electrically tested and then diced into a plurality of composite chips by sawing, a method well known in the industry. The electrically good devices are then ready for assembly into a final package having external contacts.

Figure 4A:
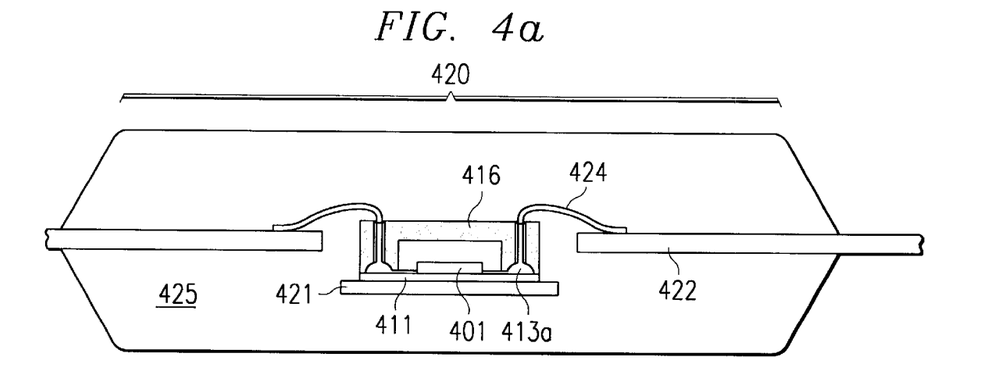
FIG. 4a shows the cross section of a plastic package housing a device encapsulated within a wafer level package.

FIG. 4a provides a cross-sectional view of an individual MEM device 401 of the preferred embodiment completely assembled in a low cost high volume plastic package 420. An array of wafer level encapsulated MEM devices having an active silicon substrate bonded to cap wafer is diced using conventional automated dicing saws, and one of the individual electrically good devices attached by an adhesive to a lead frame die pad 421. Wire bonds 424 are made through holes in the device cap to the contact pads 413a and attached to inner leads 422 of the lead frame. The bonded device is encapsulated by a polymeric compound 425 using injection molding techniques, well known and used in high volume production within the industry.

Processing temperatures for plastic assembly are well below the reflow temperature of the seal glass used to bond the cap and substrate wafers. The active device is hermetically sealed and protected from chemical and particulate contamination.

Figure 4B:
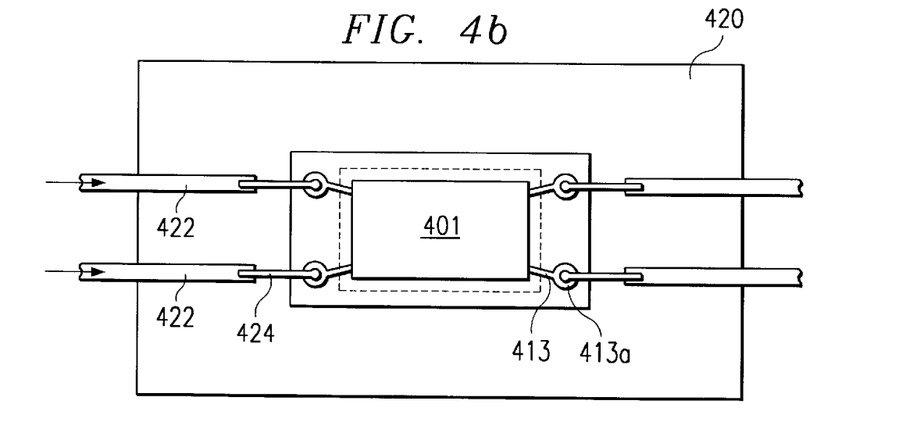
FIG. 4b is a cut away top view of a plastic package housing a device encapsulated within a wafer level package.

FIG. 4b shows a cut away view of a wafer level encapsulated MEM device 401 which is diced into individual device, wire bonded, and encapsulated in a plastic package 420. Short on-chip thin film conductors 413 between the active circuits 401 and contact pads 413a, short wire bonds 424 and symmetry in the leads 422, as well as all conductors of the entire provide a means for readily controlled electrical parameters having relatively low resistivity.

Figure 5:
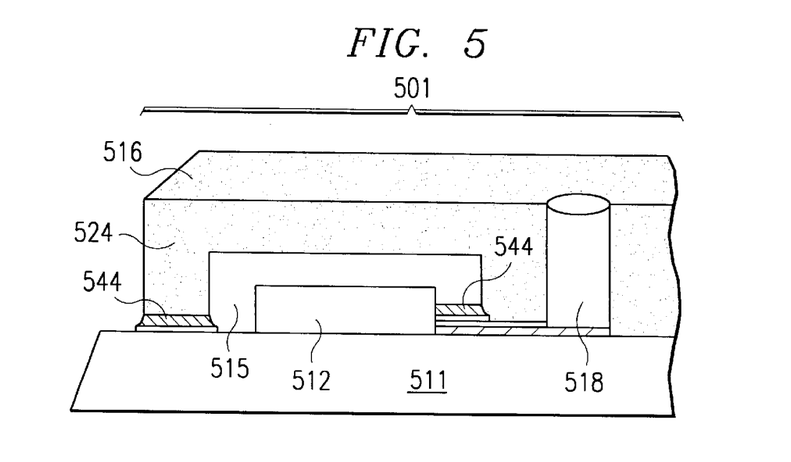
FIG. 5 is a cross sectional view of a device encapsulated within a wafer level package having an etched cap and solder seal between the cap and substrate wafers.

An alternate embodiment of the current invention is shown in cross sectional view in FIG. 5. This embodiment provides a MEM 501 wafer level encapsulated device 512 fabricated on a semiconductor substrate wafer 511 before dicing into a plurality of distinct chips. A cap wafer 516 is prepared by providing a plurality of holes 518 which extend completely through the cap wafer at predetermined locations. A pattern of etched cavities 515 having predetermined dimensions whose locations correspond to a pattern of devices 512 on a substrate wafer 511. A layer of solder 544 is deposited on the unetched portions of the cap wafer, i.e. the top surface of the cavity walls 524. The pattern is such that the device 512 will be completely surrounded by the cavity walls 524, but the moveable parts of the MEM will be free to move in all directions. Holes 518 in the cap wafer 516 are provided as was the case with the preferred embodiment. The cap wafer 516 is bonded to the semiconductor substrate wafer using the solder as the bonding agent to attach the wafers and to seal the cavities.

Figure 6A:
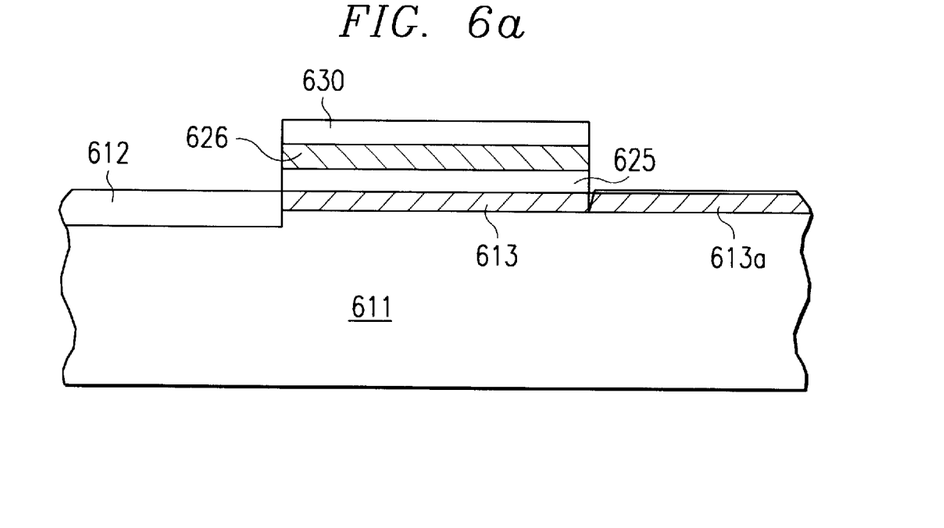
FIG. 6a shows a cross section of the insulator and metal layers on a substrate wafer prior to solder sealing to a cap wafer.
Figure 6B:
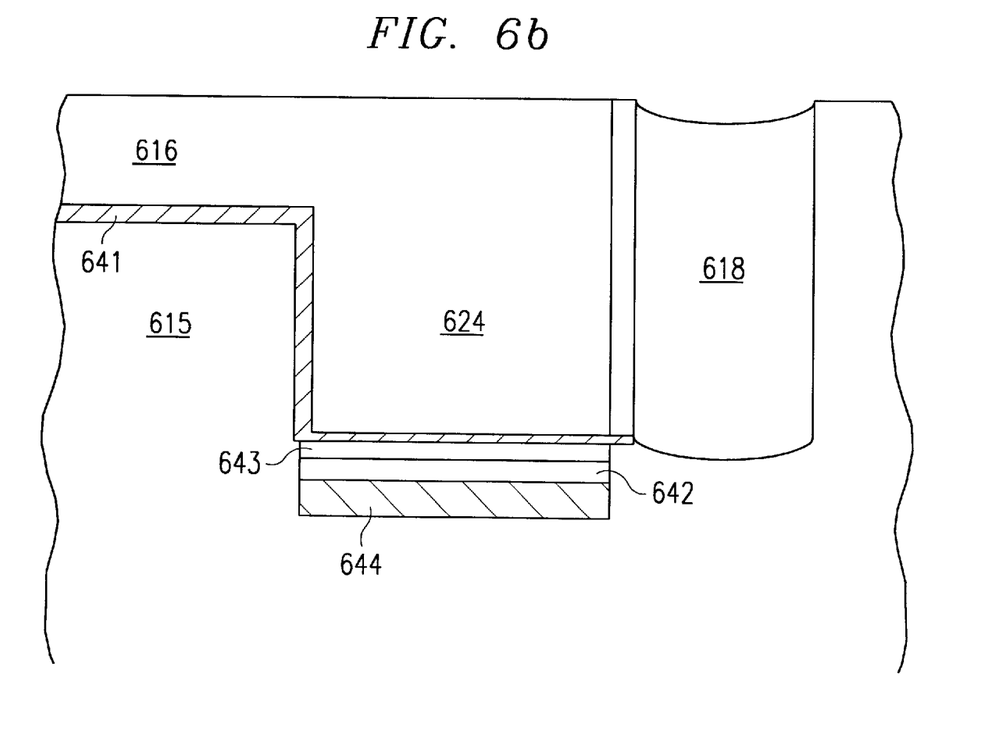
FIG. 6b is a cross sectional view of the insulators and metal layers on a cap wafer prior to solder sealing to a cap wafer.

FIGS. 6a and 6b provide more detailed arrangement of the layers of metals and insulators for a solder sealed wafer scale encapsulated MEM device. In FIG. 6a, conductors 613 between the active circuit 611 and the contact pad 613a are insulated from the solder and solderable metals by deposition a dielectric film 625 of SiO2, Si3N4 or combination, using the similar materials and technology as that providing passivation on the active circuits. The film 625 is patterned and etched to expose the contact pads 613a and to avoid any interference with the MEM operation. A thin film metal layer 630 compatible with solders, such as Au or Pd is provided in areas where the solder seal will bond the substrate to cap wafer. Such solderable metals require an adhesion layer 626 between the insulator and solderable metals. Typically the adhesion layers known within the industry are Cu, Cr or Ti/W and solderable metals are Pd and Au. The metal layers 626 and 630 are deposited by CVD or sputtering and etching using techniques well known within the industry, and typically used in flip chip and substrate processing.

In FIG. 6b the semiconductor cap wafer 616 is patterned, holes 618 provided and cavities 615 etched as described for the preferred embodiment. As shown in FIG. 6b, the entire wafer is insulated by depositing a blanket layer 641 of silicon dioxide, nitride or combination thereof onto the wafer having an array of cavities 630 of predetermined dimensions and locations, and holes 618 completely through the wafer. An adhesion layer or layers 643, and solderable metal layer 642 are deposited by CVD or sputter techniques through apertures in a mask corresponding to the top surfaces of the etched walls 624. A layer of solder 644 is deposited by sputtering through a mask onto the patterned solderable metal or by electroless plating.

Solders may be either lead containing or lead free materials, with selection of the exact composition determined by reflow temperature characteristics and alpha emissivity sensitivity of the devices. Solders available for sealing the devices can be very low temperature Indium materials, lead free composites of Sn, Ag, Cu and Sb (Castin), or any of the conventional Sn/Pb solders.

The two wafers are aligned by optical or mechanical means. The assemblage of wafers is introduced into a controlled environment chamber and the temperature programmed to heat and allow the solder to reflow and seal the individual devices. Temperature and environmental composition are dependent on the solder composition selected. The solder reflow processes are well known in the industry and the specific conditions provided by the manufacturer of solders.

The wafer assemblage comprising a substrate wafer with active MEM devices, a cap wafer having an array of cavities and walls formed by anisotropic etching and having solder compatible metals and a solder layer covering the top surface of the cavity walls, and the wafers having been bonded by solder reflow are ready for dicing into individual chips and final assembly with external electrical contacts.

In one embodiment, the contact pads of the semiconductor device have only the on-chip metallization as the active device. No insulation or additional metals are provided and as such the device is ready for assembly into a plastic package as previously described for the glass sealed embodiment.

Figure 7:
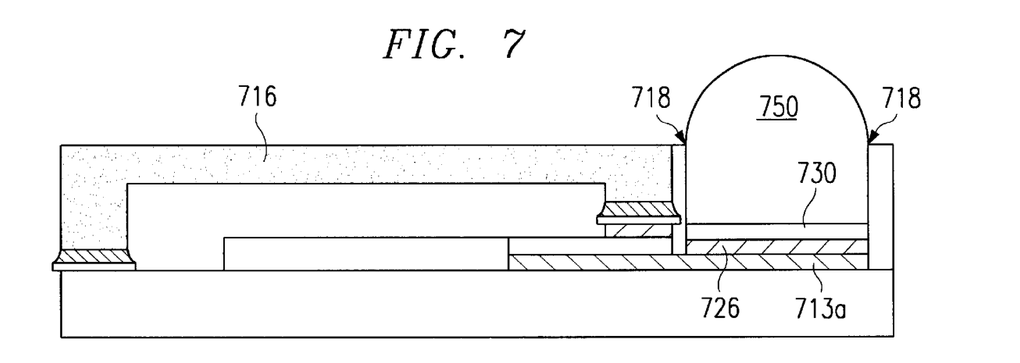
FIG. 7 is a cross sectional view of a device encapsulated within a wafer level package having etched cap and solder seal between the cap and substrate, and having a solder ball attached to the conductor.

In yet another embodiment, shown in FIG. 7, the contact pads include the following metal layers. Layer 713a, the same as the on-chip metallization, an adhesion layer 726 and a solderable metal layer 730. The adhesion and solder compatible layers were deposited by CVD or sputtering and patterned in the same operation as that described in FIG. 6a. The solderable metal layer 730 of Au or Pd on the contact pad 713a is compatible with wire bonding, or as shown in FIG. 7, may be contacted through the hole 718 in the cap 716 by a solder ball 750 for joining directly to a substrate for area array packaging, such as BGA (ball grid array) or CSP (chip scale package).

Figure 8:
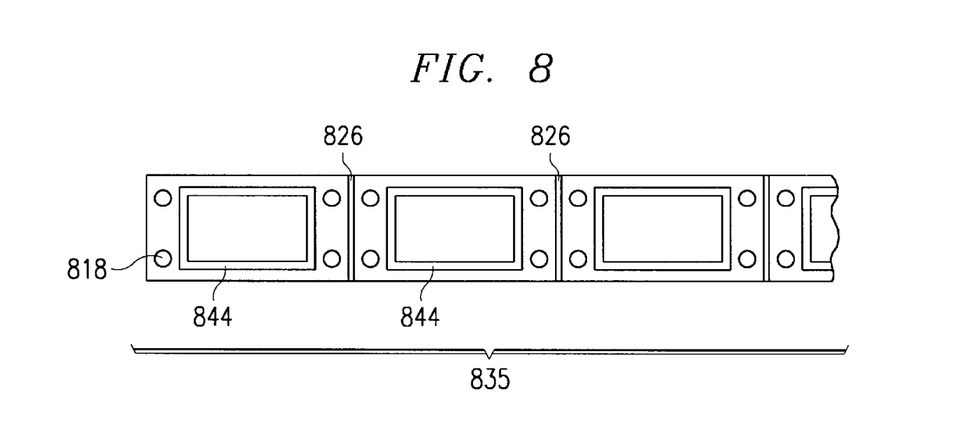
FIG. 8 is a top view of a cap wafer having a metal ring capable of providing a ground ring.

FIG. 8 provides a schematic view of portion of the second surface 835 of cap wafer. An array of scribe streets 826 are provided for separating the assembled devices. Holes 818 through the wafer are provided within each device area. The solid area 827 represent the location and area of cavity walls having a top surface covered by an electrically conductive metal and solder 844. The now conductive top surface 844 of the cavity walls provides an electrically conductive ring, isolated from the active device by the dielectric film, as described previously. In yet another embodiment, the conductive ring is electrically contacted at preselected locations to form a ground ring for the active device.

Some advantages of the solder as compared to glass sealing of wafer scale encapsulated devices are in potentially lower temperature processing, in availability of a electrical ground ring in the cap seal around each device, and that the devices are compatible with newer area array packages, such as BGA and CSP having solder contacts to the next level of interconnection.

It should be understood that while the preferred embodiments have described a wafer level package having a semiconductor chip encased in silicon substrate and cap, the method is applicable to a multiple chips within each cavity of the wafer level package, forming a multi-chip functional device.

In summary, an improved MEM wafer level encapsulated device and method for manufacture of MEM devices fabricated on a semiconductor substrate wafer before the wafer is diced into individual devices has been shown. Each individual device is encapsulated in a hermetic enclosure by etching predetermine cavity sizes in a second silicon wafer wherein the cavities locations correspond to those of the active device on a substrate wafer. The top surfaces of the cavity walls are covered with a thin film of glass sputter deposited through apertures in a mask. The two wafers are aligned and the glass reflowed, forming a hermetic seal around each active device. Holes through the cap wafer align to contact pads on the substrate which are connected electrically to the active circuits.

The thin glass minimizes run out of glass, and coupled with narrow cavity walls, allows conductors between the active circuit and the exposed contact pads to be kept short, thereby minimizing resistance of the conductors. The compact design, further, allows fabrication of more devices per wafer than with processes which require greater conductor spacing. Processes and equipment are consistent with those used in high volume semiconductor production.

An alternate process utilizing the same etched cap wafer and substrate wafer is described wherein the devices are sealed by solder reflow.

While preferred embodiments and some alternative applications of the invention have been described above, it is understood that various modifications may be made from the specific details described herein without departing from the spirit and scope of the invention as set forth in the appended claims.

What is claimed is:

1. A micro-electromechanical wafer level encapsulated device, comprising:

a plurality of devices fabricated on a semiconductor substrate wafer, a cap wafer fabricated from a silicon wafer, and an array of cavities of predetermined height etched in a pattern corresponding to the active devices on said substrate wafer, and a thin film of glass covering the unetched area, a hermetic seal produced by bonding the cap wafer to the semiconductor wafer using said thin film glass as a bonding agent such that each of said discrete devices is sealed in a cavity of predetermined dimensions, at least one conductor formed on the surface of the substrate wafer which provides electrical coupling to each device fabricated on the substrate wafer, and an array of holes fabricated in the cap wafer which provides access to each of said conductors from outside the cavity.

2. A micro-electromechanical device as in claim 1 wherein the device comprises an RF switch.

3. A micro-electromechanical device as in claim 1 wherein said conductors have equal length and resistivity.

4. A micro-electromechanical device as in claim 1 wherein said glass is in the range of 0.5 to 5.0 microns in thickness.

5. A micro-mechanical device as in claim 1 wherein walls of said cavity comprise silicon in the range of 0.05 to 0.2 mm thickness.

6. A RF switch micro-electromechanical wafer level encapsulated device, comprising:

a plurality of devices fabricated on a semiconductor substrate wafer, a cap wafer fabricated from a silicon wafer having an array of cavities of predetermined height etched in a pattern corresponding to each of the active devices on said substrate wafer, the walls of said cavities being in the range of 0.05 to 0.2 mm in thickness, and a thin film of glass in the range of 0.5 to 5.0 microns thickness covering the unetched area, a hermetic seal produced by bonding the cap wafer to the semiconductor wafer using said thin film glass as a bonding agent such that each discrete device is sealed in a cavity of predetermined dimensions, one or more conductors of equal length and resistivity formed on the surface of the substrate wafer which provides electrical coupling to each device fabricated on the substrate wafer, an array of holes fabricated in the cap wafer which provides access to each of said conductors from outside the cavity.

7. A micro-electromechanical wafer level encapsulated device, as in claim 1 wherein said device comprises multiple chips.

8. A plastic encapsulated micro-electromechanical device comprising;

a semiconductor device encapsulated within a cavity in a silicon cap, wherein said cap is bonded to the device substrate by a thin film of glass, one or more conductors on the device substrate electrically coupled to the device and extending outside the encapsulated cavity, and each of which is accessible by a hole in the cap, wire bonds connections between each of said conductors and a lead frame, and said devices are encapsulated in a plastic molding compound.

9. A micro-electromechanical wafer level encapsulated device, comprising:

a plurality of devices fabricated on a semiconductor substrate wafer, a cap wafer fabricated from a silicon wafer, having an array of cavities of predetermined height etched in a pattern corresponding to the active devices on said substrate wafer, and a film of solder adhered to a layer of solder compatible metal covering the unetched area, at least one conductor formed on the surface of the substrate wafer which provides electrical coupling to each device fabricated on the substrate wafer, said conductors further covered by a dielectric film, and a solder compatible metal layer, a hermetic seal produced by bonding the cap wafer to the semiconductor wafer using said solder as a bonding agent such that the device is sealed in a cavity of predetermined dimensions, and an array of holes fabricated in the cap wafer which provides access to each of said conductors from outside the cavity.

10. A micro-electromechanical device as in claim 9 having a solder ball attached to each conductor through said holes in the cap.

11. A micro-electromechanical device as in claim 9 having an electrical ground ring surrounding each discrete device produced by metal layers on the cap.

* * * * *